PLASTIC ENCAPSULATED TRANSISTOR AND METHOD OF MAKING SAME

Filed June 18, 1965

(Actual Size)

INVENTORS
Robert W. Helda
Milan L. Lincoln

BY Mueller, Aichele & Rauner
ATT'YS.

United States Patent Office 3,413,713

Patented Dec. 3, 1968

3,413,713

PLASTIC ENCAPSULATED TRANSISTOR AND METHOD OF MAKING SAME

Robert W. Helda, Andover, Mass., and Milan L. Lincoln, Scottsdale, Ariz., assignors to Motorola, Inc., Chicago, Ill., a corporation of Illinois Filed June 18, 1965, Ser. No. 465,123

7 Claims. (Cl. 29—588)

ABSTRACT OF THE DISCLOSURE

A plastic encapsulated semiconductor device is mass produced by a series of steps involving the use of a multiple-unit lead frame in the form of an elongated, rectangular metallic strip having a particular geometric configuration. The lead frame strip includes a continuous lead mounting portion which extends the length of the strip, and a plurality of leads integral with the mounting portion extending at right angles therefrom. The leads are arranged in spaced parallel groups joined by a continuous tie portion extending parallel to the lead mounting portion, intermediate the lead mounting portion and the lead ends. At least one lead of each group includes an end portion adapted for the bonding of a semiconductor element thereto, while the ends of the other leads of each group are adapted for wire bonding to form electrical connections with the semiconductor element. The method includes the steps of die-bonding and wire bonding to complete the electrical structure, followed by the step of encapsulating the semiconductor elements and the adjacent lead portions in plastic, and then severing the mounting portion and tie portion from the metallic strip, whereupon the completed assembly is ready for testing and separation of the individual units.

This invention relates to semiconductor devices, and more particularly a device which will lend itself to indexed continuous automatic assembly and to encapsulation in multiple units, and a method for assembling such a device.

The active element of a semiconductor device, or dice as it is called, is of very minute size. This element, when it becomes part of a semiconductor device, must be mounted so as to obtain good ohmic contact between the element and the mounting area and yet be protected from contaminating material. The present practice is to mount the element on a header from which the external leads extend. After making electrical connections to the element, the device is enclosed in a suitable protecting medium, usually a metal can, which is hermetically sealed to the header. This construction requires many hand operations during the device assembly. Also, the header must be preassembled prior to the device assembly. Thus, a sizeable portion of the cost of the device is represented in relatively expensive parts and labor costs represented in the assembly and packaging process which includes the handling of many individual parts.

Even though improvements have been made in the individual assembly of semiconductor devices and the costs vary for the different devices and assembly of each, it has not been possible to produce these devices in truly highly automated fashion.

It is an object of this invention to provide a semiconductor device and a method of assembling or fabricating the same, wherein the main portions thereof can be formed in a continuous punch press-like operation, and all of the elements can be assembled, and then encapsulated in large numbers and by automatic means to provide uniformity in the devices and low cost of manufacture.

In short, it is an object of this invention to provide structure and parts for semiconductor devices which make the device assembly more susceptible to automation in order to reduce the cost of manufacture of the device.

A further object of this invention is to provide a metal structure which aids in the assembly of semiconductor devices, and facilitates the use of high speed plastic molding techniques for encapsulating in multiples.

A still further object of this invention is to minimize in a semiconductor device the number of individual parts required for each device to reduce the cost of parts and assembly.

A feature of the invention is the provision of a punched metallic strip which has an array of individual leads and a semiconductor element mount formed in the punching operation, which remain integral at one end to continuous portions of the strip so as to facilitate handling during assembly of semiconductor devices and substantially self-jig the devices in the assembly operation.

A further feature of the invention is the provision of such a punched strip, wherein the external leads are provided in groups corresponding in number to the number of external leads ultimately required, with one lead serving as a mounting for the semiconductor element and a connection therefrom, and with adjacent leads in a group connected with the semiconductor element by wires.

Another feature of the invention is the provision of a single continuous punched strip which provides the greater part of the ultimate devices and is of a structure which facilitates original precision punching, and ultimate machine assembly of the few remaining parts as well as encapsulation.

Another feature of the invention is the provision of a mechanical structure which lends itself to high speed plastic encapsulation of the semiconductor element.

A still further feature of this invention is the provision of leads which are useful during assembly and ultimately are of a cross sectional configuration such that each lead may be readily plugged into a socket, or soldered into an electrical circuit.

A semiconductor device assembled in accordance with this invention has the semiconductor element thereof mounted directly on a portion of an external lead, which is one of a plurality of leads formed by punching a continuous one-piece metallic strip into a predetermined configuration. The strip provides the structure for many devices which can be separated at the conclusion of manufacture. The leads are held together in a precise orientation by a lead mounting portion and a tie strip which are integral with the leads. For a three electrode semiconductor device, as a transistor, the leads are provided in groups of three with each group spaced away from but connected with each adjacent group. The semiconductor element for each device made out of each group is mounted on one of the external leads in a position such that the electrodes thereof can be connected to other external leads in the group by short lengths of fine wires. The exposed semiconductor element and wires for each device made out of a group are then placed in separate cavities of a multiple cavity mold and the devices are encapsulated in a plastic material. More than fifty (50) groups have been held together during the assembly by means of the continuous tie strip and lead mounting portion. The plurality of devices thus held together are transferred to a clipper-tester which clips the connecting band and tie strip while holding the devices in a specific orientation for testing, and provides the plurality of individual units. The devices are then tested on automatic testing equipment which also segregates the devices in accordance with the appropriate test values.

Figure 1:
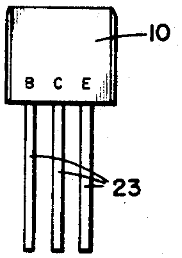
FIG. 1 is an enlarged front view of a transistor embodying the present invention.
Figure 2:
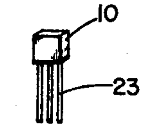
FIG. 2 is a perspective view of the transistor illustrated in FIG. 1 showing the actual size of the unit.

FIG. 1 shows a completed transistor which has been assembled in accordance with the present invention. The finished transistor consists of a plastic encapsulation 10 and the external leads 23. FIG. 2 is the actual size of a transistor assembled in accordance with this invention.

Figure 3:
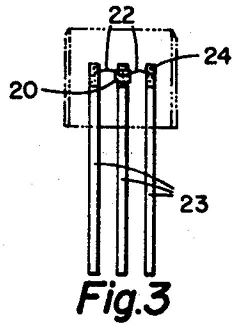
FIG. 3 is an enlarged transparent view of the assembled transistor showing the relative positions of the element, fine wires and external leads.

In the transparent view, FIG. 3, the relative positions of the external leads 23 and the active semiconductor element 20 may be seen. The active element 20 has been mounted on an external lead 23 at one end thereof, as will be described, and the fine wires 22, approximately 0.001 inch in diameter, have been connected to the adjacent external leads 23. The element 20 and the other external leads are positioned so that the fine wire 22 in very short lengths can be used to connect the parts together.

Figures 4A, 4B, 4C:
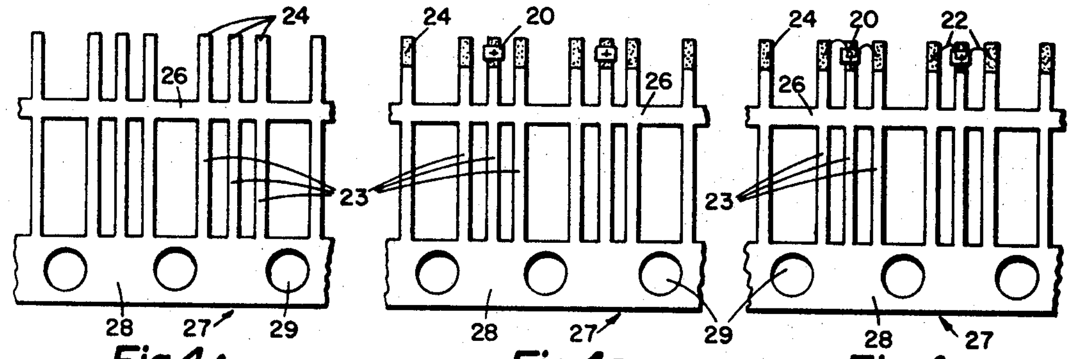
FIG. 4A is an enlarged view of a punched metallic strip showing mounting pads, external leads, tie strip and lead mounting portion.
FIG. 4B is an enlarged view of a punched metallic strip showing mounted elements and gold plated mounting pads.
FIG. 4C is an enlarged view of a punched metallic strip showing mounted elements connected to external leads by fine wires.
Figures 5A, 5B:
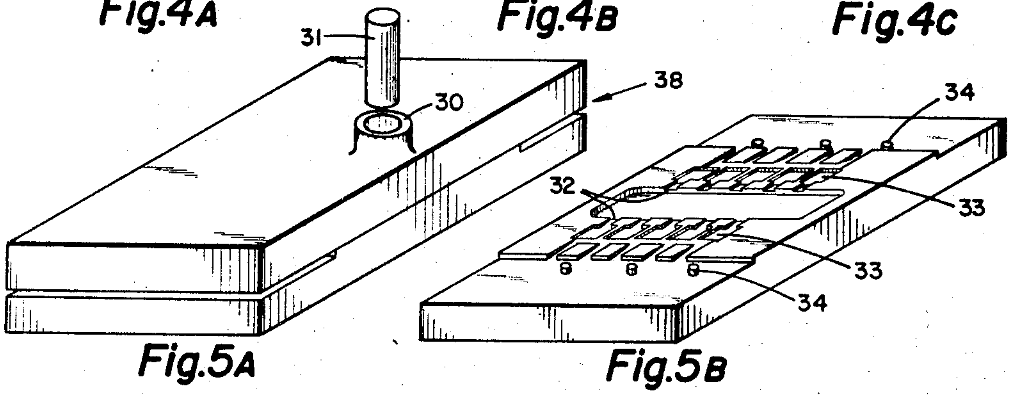
FIG. 5A is a perspective view of a transfer mold used for encapsulation of the devices.
FIG. 5B is a perspective view showing the bottom die of the transfer mold illustrated in FIG. 5A.

FIG. 4A illustrates a punched metallic strip which includes mounting pads 24, a tie strip 26, and a lead mounting portion 28. The strip in its entirety has been made up with fifty (50) or more groups of leads, and the mounting pad 24 for the element 20 in each group is at an end of a lead, and is spaced laterally from each adjacent lead. There is a mounting pad 24 on an end portion of each lead to accommodate a wire or element as shown in FIG. 4C.

In the embodiment of the invention illustrated, each mounting pad is spaced on the order of 0.05 inch from an adjacent end portion of a lead in the same group. The tie strip 26 maintains the precise location of each mounting pad and acts as a closing point for the mold 38 during the encapsulation process. The lead mounting portion 28 has indexing holes 29 which are used in the automatic bonding of the element to a pad 24, for wire bonding and for encapsulation of the device. The lead mounting portion 28 in conjunction with the tie strip 26 holds the plurality of devices together during the various assembly steps.

In FIG. 4B, a transistor element 20 is mounted on a mounting pad 24 which is part of an external lead 23. This mounting pad 24 has been gold plated so that the element may be bonded directly thereto. The metallic strip 27 is placed in an automatic feed mechanism which, by means of the indexing holes 29, positions the mounting pads 24 for each transistor under the element bonding equipment in a predetermined attitude and orientation. This precise method allows the transistor element 20 to be mounted automatically on the mounting pad 24.

Fine wires 22 are used to connect the electrodes of the transistor elements 20 to the gold plated mounting pads 24 on the other external leads 23 comprising the transistor device. The metallic strip 27 with the transistor elements 20 on selected mounting pads is placed in an automatic feeding mechanism which, by means of the indexing holes 29, positions the mounting pads 24 of each transistor under the wire bonding equipment in a predetermined orientation and attitude. This precise method reduces the wire bonding time by reducing the number of operator manipulations required.

The connected assembled devices, each consisting of an active element 20, fine connecting wires 22, and external lead 23, are placed in a multiple cavity mold 38. Each cavity 33 accommodates one assembly which will ultimately be cut off to serve as a single device. Locating pins 34 extending upwardly from the bottom portion of the mold 38 engage the indexing holes 29 in the connecting band 28 to facilitate alignment of the assemblies in the mold 38. The mold closes on the tie strip 26, thereby avoiding the necessity of the mold mating in the areas between the external leads 23.

Figure 6A:
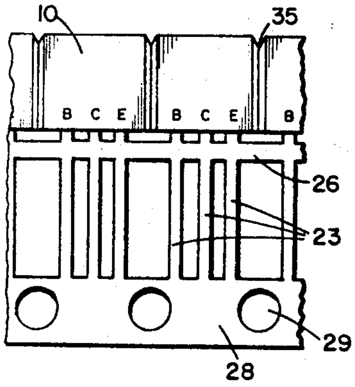
FIG. 6A is a front view of the encapsulated devices joined by the lead mounting portion and the tie strip shown in FIGS. 4A–4C.

A thermosetting epoxy plastic material is forced into the mold through the cylindrical passage 30 and the combination of the pressure from the piston 31 and the mold temperature results in the epoxy material entering the cavities 33 through the gates 32 at the lowest viscosity of the epoxy. Because of this low viscosity, the shortness of the fine wires and the position of the gates, the fine wires are not broken during this encapsulation process. In a very short time the epoxy material cures and the finished molding, FIG. 6A, is removed. The encapsulated devices are joined by the lead mounting portion 28, the tie strip 26 and the plastic encapsulation 10 which has a break point 35 provided to faciliate the separation of the devices after electrical testing.

Figure 6B:
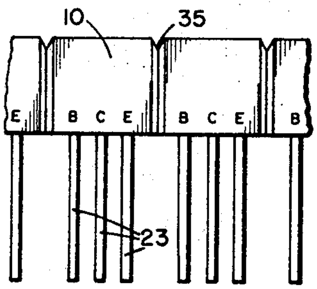
FIG. 6B is a front view of the encapsulated devices after the lead mounting portion and the tie strip have been clipped.
Figure 6C:
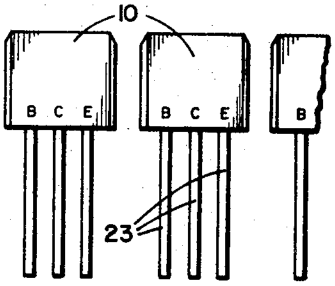
FIG. 6C is a front view of the devices after separation and testing.

FIG. 6B shows the devices after being sent to a clipper-tester which removes the lead mounting portion 28 and the tie strip 26, shown in FIG. 6A, leaving the units connected by the plastic encapsulation 10 so that a specific orientation of the plurality of devices may be obtained automatically when the devices are tested in a testing machine. After testing, the devices (FIG. 6C) are separated along the break points 35 (FIG. 6B) and are segregated according to the appropriate test values.

A mounting strip fabricated as herein disclosed greatly improves the assembling and encapsulation of a semiconductor device by permitting the automation of the mounting of the element, wire bonding and encapsulation of said device. By changing the number of external leads and the location of the mounting areas, more complex devices may be assembled in accordance with this invention.

We claim:

1. A method for the mass production of semiconductor devices including the steps of:

(a) providing a metallic frame member for use in the fabrication of a plurality of semiconductor devices on the frame member, said frame member having mounting portion means, a plurality of spaced groups of metal means integral with said mounting portion means and each such group being for an ultimate semiconductor device, and tie strip means integral with metal means extending parallel to a said mounting portion means and positioned intermediate said mounting portion means and metal means end portions, with said mounting portion means and tie strip means maintaining said metal means in stabilized positions during fabrication steps for said semiconductor devices;

(b) bonding a semiconductor element to a portion of a metal means in each of said groups;

(c) electrically connecting said semiconductor element in each group to an adjacent end portion of other metal means in said group;

(d) placing a metallic frame member in one part of a mold having two mating parts and a plurality of cavity portions in each part, with each semiconductor element in each frame member group and the adjacent end portions of metal means in that group positioned in a cavity portion in one mold part, and with tie strip means in said group positioned in a portion of that mold part adjacent a cavity portion;

(e) closing the two-part mold to form a plurality of closed cavities therein with a closed cavity for each said group and coincidentally closing the mold on said tie strip means, with the latter means acting as a closing point within the mold in the area between each adjacent and spaced apart metal means outside a closed cavity and within the closed mold;

(f) encapsulating in plastic said semiconductor elements and the corresponding adjacent portions of metal means; and (g) severing the mounting portion means and the tie strip means from the metallic frame member to physically and electrically separate the individual metal means as well as the groups of metal means and provided a plurality of independent semiconductor devices.

2. A method of manufacturing a semiconductor device including the steps of:

(a) forming a metallic strip which has a plurality of metal means with lead contact portions thereon provided in groups of a predetermined number of metal means, with each group spaced from adjacent groups, and with said metallic strip having integral severable portions to maintain said metal means in precise locations and in spaced relationship to one another during fabrication, with one integral severable portion having index apertures therein and another severable integral portion adapted to act as a tie strip and a closing point in the closed plastic mold during plastic encapsulation;

(b) placing the metallic strip in an automatic bonding machine in a position determined by indexing points thereon;

(c) mounting and bonding a semiconductor unit on an end portion of each of predetermined ones of said metal means during movement through the machine;

(d) electrically connecting each semiconductor unit to the end portion of each of other metal means in a group;

(e) plastic encapsulating in a closed mold having molding cavities each of the semiconductor units and the corresponding adjacent metal means portions for a group while the metal means are held together by said integral portions and the another integral portion acts as a closing point in the closed plastic mold outside the molding cavities therein but within said closed mold;

(f) opening the mold to remove the metallic strip; and (g) severing the one integral portion and the another integral portion, which latter acted as the closing point in the mold, in order to separate the individual semiconductor devices corresponding to each said group of metal means.

3. A method for mass production of plastic encapsulated semiconductor devices on a metallic frame member wherein semiconductor units are mounted on portions of the metallic frame member and connected into the frame member for ultimate electrical conduction and for encapsulation in plastic, and for subsequent separation of the frame member with plastic encapsulated portions thereof into a plurality of encapsulated semiconductor devices, which method includes steps of:

(a) providing a one-piece metallic frame member having a plurality of predetermined groups of metal means connected to mounting portion means, and said frame member having tie strip means extending transversely of metal means at a position spaced laterally from a mounting portion means to which the metal means are connected and parallel to said mounting portion means;

(b) positioning a metallic frame member in a machine for movement through said machine for connecting semiconductor units to selected metal means in said frame member;

(c) mounting and connecting a semiconductor unit on a portion of each such selected metal means and conductively connecting electrodes of the semiconductor unit to end portions of metal means in a predetermined group with which said selected metal means is associated;

(d) positioning the metallic frame member in a plastic mold having multiple cavities, with a semiconductor unit, the conductive connections thereto and the portions of metal means to which connections are made positioned in one of said cavities of the mold, and with the tie strip means positioned in the plastic mold outside the cavities but within the mold to act as a closing point for the mold when the mold is closed for the encapsulation step;

(e) encapsulating in plastic the structure positioned in each cavity and with the tie strip means performing a mold closing function outside the cavities but within the mold during such molding to prevent plastic leakage out of the cavities into the areas between spaced apart metal means of the frame member; and (f) severing the mounting portion means and tie strip means in the metallic frame member to separate the individual encapsulated semiconductor devices.

4. A metallic frame member for use in the fabrication of a plurality of semiconductor devices and in the plastic encapsulation of such devices in a plastic mold having a plurality of mold cavities, said metallic frame member comprising severable mounting portion means on the frame member, a plurality of individual metal means in predetermined groups with each metal means in a predetermined group spaced from each other metal means in such a group and being secured at one end to severable mounting portion means, with one metal means of each predetermined group having a portion thereof with a semiconductor-unit-mounting-area thereon spaced from the severable mounting portion means, and with said mounting area being adjacent to an end portion of each of the remaining metal means in a group, severable tie strip means extending transversely to metal means in a predetermined group and parallel to severable mounting portion means and connected to metal means in such a predetermined group, with the position of said tie strip means in the frame member being between severable mounting portion means and said end portions of the metal means in a predetermined group which are adjacent to a mounting area, with both said tie strip means and said mounting portion means adapted to support and stabilize the position of metal means relative to one another during steps in the fabrication of a plurality of semiconductor devices, and with said tie strip means during a plastic encapsulation step for the semiconductor devices in the mold cavities of a closed plastic mold adapted to act as a closing point for the plastic mold within such a closed plastic mold in the area between each two adjacent but spaced apart metal means at portions of said metal means which are adapted to be positioned outside the closed plastic mold cavities but within the plastic mold during such a plastic encapsulation step.

5. A metallic frame member for use in the fabrication of a plurality of semiconductor devices and in the plastic encapsulation of such devices in a plastic mold having a plurality of mold cavities, said metallic frame member comprising severable mounting portion means on the frame member extending longitudinally over the length of the frame member, a plurality of individual metal means in predetermined groups with each metal means in a predetermined group spaced from each other metal means in such a group and being secured at one end to a severable mounting portion means, with one metal means of each predetermined group which is integral at one end with said severable mounting portion means having a portion at the other end portion thereof with a semiconductor-die-mounting-area thereon, and with said other end portion being adjacent to an end portion of each of the remaining metal means in a predetermined group, severable tie strip means extending longitudinally over the length of the frame member transversely to all said metal means and connected to each metal means in each predetermined group and parallel to a severable mounting portion means, with said tie strip means located in the frame member between severable mounting portion means and said other end portion of said metal means as well as said adjacent ends of the metal means, with both said tie strip means and said severable mounting portion means adapted to support and stabilize the position of each metal means in the frame member relative to one another during steps in the fabrication of a plurality of semiconductor devices on the frame member, and with said tie strip means adapted during a plastic encapsulation step for the semiconductor devices in a plastic mold to act for the closed plastic mold cavities in a closed mold as a closing point in the area between each two adjacent but spaced apart metal means in the closed mold at the portions of said metal means which are adapted to be positioned outside the closed mold cavities but within such a closed mold, said tie strip means and said mounting portion means adapted to be severed after such a plastic encapsulation step to provide said outside-positioned-portions of said metal means as outside contact leads in a fabricated semiconductor device.

6. A metallic frame member for use in the fabrication of semiconductor devices, comprising a one-piece metal strip having a lead mounting portion extending the length of said member, a plurality of leads integral with said mounting portion each having a contact portion extending at right angles thereto in the same general plane as said mounting portion, said leads being provided in groups of three leads which are parallel to one another over the length of their contact portions, and with each group spaced along the mounting portion longitudinally from an adjacent group, with each said group including one lead having a pad portion at one end thereof adapted to have a semiconductor element secured thereto and adapted as a semiconductor device is being fabricated to have electric connecting means connecting such an element with each of the other two leads adjacent to the pad portion in a group, and a tie strip extending parallel with the mounting portion and integral with all of said plurality of leads at a position between the mounting portion and the lead ends, said mounting portion and said tie strip being of such structure and material that they will maintain said plurality of leads and the groups thereof spaced positively with respect to one another during device fabrication and can be severed in the final step of device fabrication, and said mounting portion having indexing means therein to index the movement of the one-piece metal strip in automated fabrication of semiconductor devices.

7. Metallic frame means for use in the fabrication of a plurality of plastic encapsulated semiconductor devices and serving as the frame means for such devices comprising a metal strip with predetermined groups of metal leads which leads in a group correspond in number to the ultimate contact lead and semiconductor unit requirements for each of the semiconductor devices to be fabricated, each said predetermined group including a plurality of spaced apart metal leads one of which is selected to have a semiconductor unit secured to a portion thereof, another of said metal leads in said predetermined group having one end thereof positioned adjacent the portion of the selected metal lead, said metallic frame means having two parallel spaced apart strip portions extending the length thereof and each integral with each metal lead in said frame means, with one strip portion having index apertures at spaced intervals therein for indexing the movement of the metallic frame means through an assembly machine, the other of said strip portions being integral with each metal lead at a position between said one strip portion and the end of each metal lead, with both said strip portions adapted to be severed from the metal leads after the plastic encapsulation of semiconductor devices on the metallic frame means, and with said other of said strip portions adapted to maintain the position of said metal leads spaced apart relative to one another during the fabrication of said semiconductor devices and adapted to act as a closing point between spaced apart metal leads and adjacent a molding cavity within a closed plastic mold during a plastic encapsulating step in such device fabrication.

References Cited

UNITED STATES PATENTS

| | | | |
|---|---|---|---|
| 3,118,016 | 1/1964 | Stephenson | 174—68.5 |
| 3,222,769 | 12/1965 | Le Plae | 29—413 |
| 3,317,287 | 5/1967 | Caracciolo | 29—193 |
| 3,171,187 | 3/1965 | Ikeda | 29—574 |
| 3,281,628 | 10/1966 | Bauer | 317—234 |

FOREIGN PATENTS

| | | |
|---|---|---|
| 1,048,624 | 1/1959 | Germany. |

WILLIAM I. BROOKS, *Primary Examiner.*